United States Patent
America et al.

(10) Patent No.: US 7,404,874 B2
(45) Date of Patent: Jul. 29, 2008

(54) METHOD AND APPARATUS FOR TREATING WAFER EDGE REGION WITH TOROIDAL PLASMA

(75) Inventors: William George America, Kingston, NY (US); Steven Hilton Johnston, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 10/710,226

(22) Filed: Jun. 28, 2004

(65) Prior Publication Data

US 2005/0284576 A1    Dec. 29, 2005

(51) Int. Cl.
*C23C 16/00* (2006.01)
*C23F 1/00* (2006.01)
*H01L 21/306* (2006.01)

(52) U.S. Cl. .................. 156/345.43; 156/345.44; 156/345.77; 118/723 E

(58) Field of Classification Search ................ 156/345.43–345.45, 345.47; 118/723 E
See application file for complete search history.

(56) References Cited

U.S. PATENT DOCUMENTS

| | | | |
|---|---|---|---|
| 4,875,989 A | | 10/1989 | Davis et al. |
| 5,498,313 A | | 3/1996 | Bailey et al. |
| 5,895,530 A | * | 4/1999 | Shrotriya et al. ............ 118/715 |
| 6,004,631 A | * | 12/1999 | Mori ........................... 427/534 |
| 6,265,328 B1 | | 7/2001 | Henley et al. |
| 6,546,938 B2 | | 4/2003 | Selwyn et al. |
| 6,620,736 B2 | | 9/2003 | Drewery |
| 2004/0216843 A1 | * | 11/2004 | Peng ...................... 156/345.31 |
| 2004/0238488 A1 | * | 12/2004 | Choi et al. .................... 216/58 |

FOREIGN PATENT DOCUMENTS

| | | |
|---|---|---|
| JP | 2000109980 | 4/2000 |
| KR | 3002241 | 1/2003 |
| WO | WO03/075333 | 9/2003 |

OTHER PUBLICATIONS

Title: Cleaning of Wafer Edge, Bevel and Back-Side With a Torus-Shaped Capacitively Coupled Plasma (Plasma Sources Sci. Technol. 11 (Nov. 2002) 520-524) Authors: Buil Jeon, Hong-Young Chang, Jong-Kyu Song, Chang-Won Jeon Date: Published Nov. 6, 2002 Article Enclosed.

* cited by examiner

*Primary Examiner*—Karla Moore
*Assistant Examiner*—Rakesh K Dhingra
(74) *Attorney, Agent, or Firm*—Howard M. Cohn; Lisa U. Jaklitsch

(57) ABSTRACT

Method and apparatus for treating an edge region of a wafer. A toroidal shaped plasma cavity has an inner diameter which is slightly less than the diameter of the wafer being treated so that only the edge region of the wafer extends into the toroidal plasma cavity. An inert gas is flowed across a front and back side of the wafer into the plasma cavity. A reactive gas is flowed directly into the plasma cavity. The gases exit the plasma cavity without flowing over the surface of the wafer.

12 Claims, 1 Drawing Sheet

METHOD AND APPARATUS FOR TREATING WAFER EDGE REGION WITH TOROIDAL PLASMA

BACKGROUND OF INVENTION

The invention relates to semiconductor device fabrication and, more particularly, to techniques for removal of residual process films (e.g., polymeric and refractory films) and debris from the edge region (perimeter and bevel) of a semiconductor wafer.

Semiconductor wafers are typically round (circular, disc-like), usually having a diameter ranging from 150-350 mm and a thickness of 1-1.5 mm. Integrated circuit (IC) devices are formed in an interior "device area" on the front (or device) side of the wafer. Typically, nothing is formed on the back side of the wafer. The edge (perimeter) of the wafer is typically beveled.

The normal processing of semiconductor manufacture include the deposition of numerous films, many of which serve as insulators for the creation of inter-level dielectric layers to isolate the metal lines between each level. These films are often organic polymers (e.g. SiLk®), silicon dioxide, carbon substituted silicon dioxide, silicon nitride, silicon oxynitride, silicon carbide and nitrogen substituted silicon carbide and tantalum nitride or tantalum oxide. These films are deposited to serve as diffusion barriers between metal levels, the inter-level dielectric (ILD), or masking layer. Masking layers are frequently used for the reactive ion etching (RIE) or as a polish stop during chemical-mechanical planarization (CMP). The number of films deposited for each level and the number of levels needed for modern semiconductor devices (often 10 or more) results in layers of films on the wafer perimeter that are usually highly stressed. When stress for the film exceeds the yield strength the films crack and delaminate resulting in a release of unwanted particulate across the device area of the wafer. Theses foreign materials reduce wafer device yield.

A semiconductor wafer that has been processed in a typical manner can have undesirable films and or residues on the perimeter or beveled edges of the wafer, in what is referred to herein as the "edge region" of the wafer. These films may result from a processing step during film deposition or as a consequence of a plasma etch process used to form three-dimensional features in the wafer, including vias or trenches. Frequently though, the deposition of the film occurs across the full area of the device side of the wafer, the beveled edges and a small segment of the perimeter of the back side of the wafer. There are frequently several films deposited per device level. This film(s) deposition is often repeated numerous times for each level of the semiconductor manufacturing process. Consequently, these multiple layers which build up in the edge region can result in high film stresses which in turn fracture and result in shards or fragments of the films landing on the device side of the wafer. These unwanted pieces of foreign matter can result in unwanted defects in the device area of the wafer, reducing performance or device yield. The need to remove excess deposits from the edge region of the wafer is understood by those skilled in the art.

Chemical spray processes have been used to remove polymeric films in the edge region, but with limited success owing to limitation of reagents that can be used with acceptable selectivity to the other films present. Special protective means are needed by wet processes to prevent unwanted chemical attack to device area of the wafer.

Plasma processes have been developed where the etch tool itself has been modified to remove unwanted films at the edge of the wafer. Most often, the plasma power is applied through the full body of the wafer risking unwanted etching of the wafer or plasma induced damage. Also the plasma processes do not necessarily get to the bevel of the wafer where the unwanted films may have also been deposited.

"Wafer Edge Region Cleaning With A Torus-Shaped Capacitively Coupled Plasma" by Buil Jeon et al., Department of Physics, Korea Advanced Institute of Science and Technology (KAIST), Guseong-dong, Youseong-gu, Daejeon, Korea (hereinafter referred to as "Jeon"), discloses a torus-shaped Capacitively Coupled Plasma (CCP) source to remove harmful film layers and particles deposited on a wafer's edge, bevel and backside during film deposition or other semiconductor processes. A plasma is generated along 2 mm of an edge and 4 mm of a backside of a wafer. Therefore, films and particles can be removed from the wafer edge, bevel and backside without damaging patterns elsewhere on the wafer.

In Jeon's technique, the wafer is placed on a powered electrode surrounded by two grounded electrodes. A ceramic gas distribution panel (GDP) is disposed between 0.3 mm-0.5 mm from the front side of the wafer. Due to this very narrow gap between the GDP and the wafer, plasma could not be generated on the inner side of a wafer where the semiconductor chip patterns are located.

Jeon's process/apparatus creates a torus-shaped plasma that encompasses the edge perimeter of the semiconductor wafer. In this apparatus the wafer rests on an RF powered electrode and has a gas distribution plate (GDP) over the majority of the wafer leaving only an predefined region of the wafer perimeter uncovered. The size of the powered electrode is also sized such that the back surface of the wafer has a region that is uncovered area and is similar to the wafer top face. Gases are flowed through the openings between the concentric GDP plates and upper perimeter grounded electrode. An RF (13.56 MHz) plasma is generated between the powered wafer/electrode and the grounded electrode. The spacing between the GDP and the wafer surface is between 0.3 and 0.5 trim.

Jeon's plasma created results in etching of films on the exposed areas of the wafer including the front, edge, and back areas of the wafer. Additionally, the front area of the wafer under the GDP is also etched but at decreasing amounts towards the center of the wafer. This etching under the GDP results from some penetration of the plasma into the space between the GDP and the wafer face but is most likely from the diffusion of reactants from the plasma toward the wafer center. The data presented in FIG. 4 shows a change of film thickness at the center of 8000 Å to the open area of 3000 Å. The greatest change occurs under the GDP with a 5000 Å reduction in film thickness. Part of the powered wafer/electrode influence is to induce reaction between diffused reactants and the film as a direct effect of the RF power.

SUMMARY OF INVENTION

According to the invention, generally, a radio frequency (RF) plasma confined in the center of a toroid circumscribing the edge region of the semiconductor wafer using preselected gas(es) removes part or all of a deposited film. The film to be removed is often from deposition of numerous films, such as dielectrics, or the by-product of a plasma etch process that deposits organofluoropolymer on the edge and bevel portion of the wafer. These films will build up for each level or wafer processing and result in particulates being released onto the wafer as a result of inherent stress of the film. Particulates can cause opens in electrical connections and metal lines resulting in product fails. The significant advantage of a toroidal plasma process is it that can remove unwanted films rather than modifying a dry etch process which may impact critical dimensions and profile resulting in reduced product yield. The toroidal plasma process of the present invention can be applied to other films commonly deposited throughout the semiconductor manufacturing process. This process may be used to change the edge profile of deposited films, including dielectrics and conductors, and remove or shape the edge profile of applied photoresist or other organic films.

The toroidal plasma is created at the edge region of a wafer. With proper gases in the plasma, films can be removed from the edge region, not only on the front perimeter of the wafer but on the beveled edge and wafer backside perimeter as well. The toroidal plasma is applied to the wafer top and bottom perimeter and wafer edge and readily removes the films form these areas. Selective removal of the films is also possible through selection of the gases that make up the plasma. Using argon with oxygen will remove organics such as photoresist and antireflection coatings and organic dielectrics but will not attack the more common hard dielectrics such as silicon oxide, silicon nitride, or silicon carbide.

According to one aspect of the invention, a method of treating an edge region of a wafer comprises the steps of: providing a toroidal shaped plasma cavity; providing electrodes in the plasma cavity; disposing an edge region of the wafer within the plasma cavity; and forming a plasma within a plasma cavity. The electrodes are connected to an RF source and ground. The edge region of the wafer extends into the toroidal plasma cavity. An inert gas is flowed across a front and back side of the wafer into the plasma cavity and a reactive gas is flowed directly into the plasma cavity.

According to another aspect of the invention, an apparatus for treating an edge region of a wafer comprises a toroidal shaped plasma cavity; and electrodes disposed in the plasma cavity. The toroidal shaped plasma cavity has an inner diameter which is slightly less than the diameter of the wafer being treated, so that only the edge region of the wafer extends into the toroidal plasma cavity. Means are provided for flowing an inert gas across a front and back side of the wafer into the plasma cavity; for flowing a reactive gas directly into the plasma cavity; and for allowing gases to exit the plasma cavity without flowing over the surface of the wafer.

The present invention provides a generic tool and process that can be used to remove unwanted films on the perimeter and bevel of wafers. Only the perimeter of the wafer and the bevel are treated and the device portion of the wafer is protected from the plasma. Since only the problem areas of the wafer perimeter and bevel are treated, unwanted modification of the dry etch process (which can impact critical dimensions and profile resulting in product yield) is avoided. This tool/process is not limited to plasma etch processes but can be applied to other films commonly deposited throughout the semiconductor manufacturing process. This process may be used to change the edge profile of deposited films, including dielectrics and conductors, and remove or shape the edge profile of applied photoresist.

In this manner, unwanted films are removed from the edge of the wafer after the film has been deposited from either the plasma etch process or by a typical semiconductor deposition process. The invention is suitable for any deposited film that can form volatile by products from common gases used in the semiconductor industry.

The toroidal plasma of the present invention is created from a parallel, symmetric plate configuration. The wafer is not powered. This arrangement allows only the desired perimeter area (edge region) of the wafer to be influenced by the plasma. The spacing between the two electrodes can be precisely controlled by machined stops in one or both of the electrode assemblies.

An inert gas is flowed over both the front and back of the wafer. Through proper design the reactants formed in the plasma cannot diffuse to any appreciable extent onto the wafer face. Also another separate ring inside the electrode assembly can be used to withdraw unwanted reactants away from the wafer face. The invention allows the use of many gases to not only remove unwanted organic polymer from a plasma etch process but the gas(es) can be changed to remove other films that had been deposited during the normal wafer processing. For example oxygen can be used to remove organic films and oxygen with a small amount of CF4 can be used to remove fluoroorganopolymers. Silicon dioxide and silicon nitride films can be removed with CF4 and oxygen and argon that is flowed over the wafer and into the toroidal chamber.

BRIEF DESCRIPTION OF DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION

Figure 1:
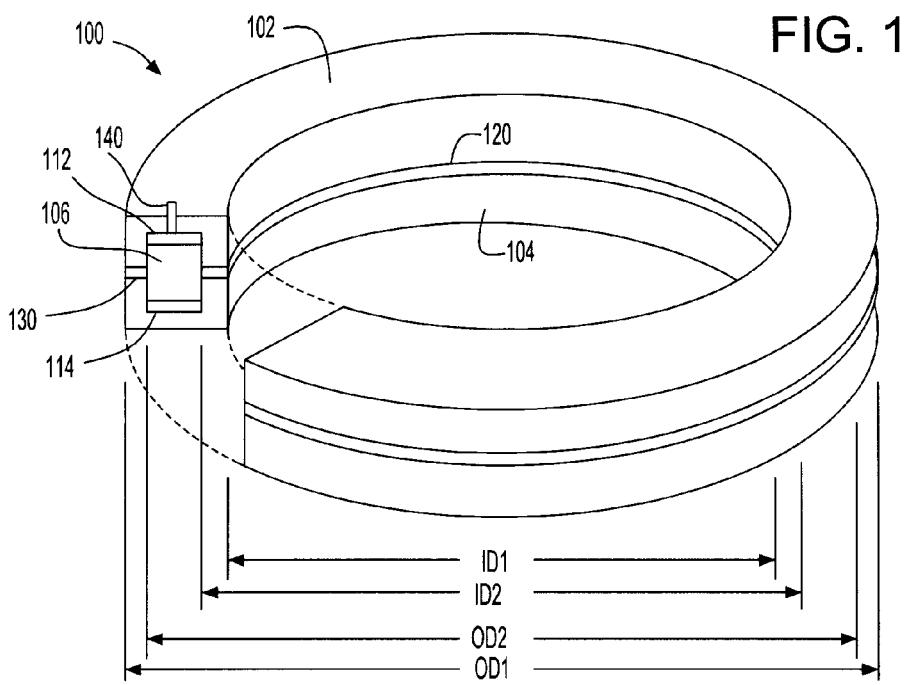
FIG. 1 is a perspective view of a plasma chamber for practicing the invention.

In the description that follows, numerous details are set forth in order to provide a thorough understanding of the present invention. It will be appreciated by those skilled in the art that variations of these specific details are possible while still achieving the results of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, sometimes their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

Figure 2:
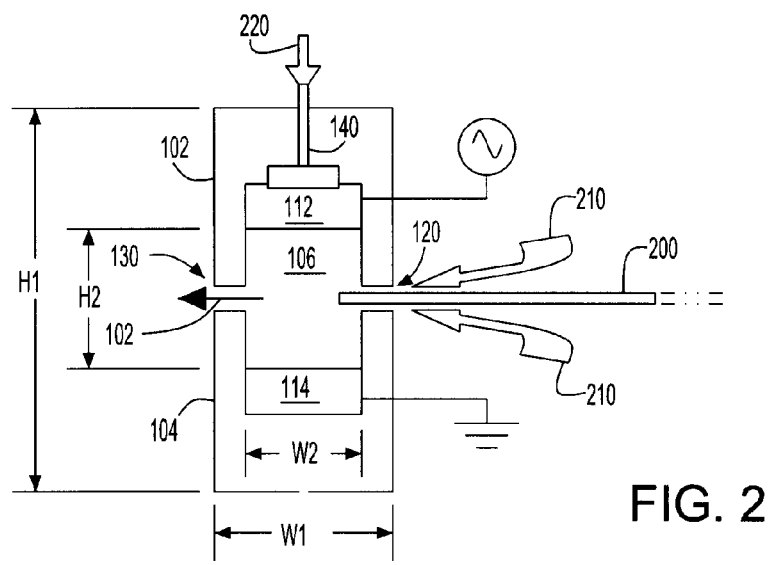
FIG. 2 is cross-sectional view of the plasma chamber of FIG. 1

FIG. 1 and FIG. 2 illustrate an embodiment of a plasma chamber 100 for practicing the present invention with a semiconductor wafer 200 having a diameter (IDW) of 295 mm and a thickness of 1 mm.

The plasma chamber 100 is generally in the form of a ring (or torus, or toroid), having an inside diameter (ID), an outside diameter (OD) and a height (H1). (A torus is a ring-shaped surface generated by rotating a circle around an axis that does not intersect the circle. A toroid is the doughnut-shaped object enclosed by a torus.) The cross-section of the plasma chamber 100 is generally rectangular, the rectangle having a height H and a width W1=OD−ID. Exemplary dimensions for the plasma chamber 100 are:

OD1=329 mm
ID1=269 mm
H1=70 mm
W1=50 mm

The plasma chamber 100 has a generally U-shaped upper portion 102 and a generally U-shaped lower portion 104. (A "U-shaped" element generally has a base segment and two leg segments extending generally parallel to each other from opposite ends of the base segment.) The U-shaped upper and lower portions oppose each other (but, as described in greater detail hereinbelow are spaced apart from one another) forming an enclosed space (plasma cavity) 106 therebetween. (The "plasma cavity" 106 can also be called a "reaction chamber". In any event, this space where the plasma occurs is defined and confined by the apparatus and structure of the overall "plasma chamber" 100.)

The plasma cavity 106 is in the form of a ring (or torus, or toroid), having a cross-section which is generally rectangular—the rectangle having a height H2<H1 and a width W2<W1. Exemplary dimensions for the plasma cavity 106 are:

H2=70 mm
W2=30 mm

A very relevant dimension is the inner diameter ID2 of the plasma cavity 106, and is discussed in greater detail hereinbelow. (Using the numbers above, the ID2 would be 275 mm.) An outer diameter OD2 for the plasma cavity 106 would simply be OD2=ID1+2*W2.

The plasma cavity 106 is sized so that an edge exclusion area (EEX) of the wafer is contained in the plasma cavity 106, for treatment.

Exemplary relationships are:
IDW=wafer diameter=295 mm.
EEX=edge exclusion=3 mm, $$ID2=IDW-2*EEX=289 \text{ mm},$$

$$ID1=ID2-(W1-W2)=289-20=269 \text{ mm},$$

$$OD1=ID2+(W1-W2)/2+W2)=329 \text{ mm}$$

In this case, the plasma cavity 106 encompasses a band of 3 mm width of the wafer perimeter. This would be useful to remove films on a wafer with a 3 mm edge exclusion.

Treating a wafer with a larger, 5 mm edge exclusion (EEX=5 mm) would require different dimensions for the plasma cavity 106; for example:

OD1=315 mm
ID1=255 mm
H1=70 mm
W1=50 mm

These (for EEX=5 mm) dimensions can also be used to treat a 3 mm edge exclusion by controlling the plasma power and pressure. Increasing the plasma power will increase the plasma diameter in the plane of the wafer. Normally, the power level is set to be not so high as to completely fill the cavity and extend through the gaps of the upper and lower electrode. Increasing the pressure of the chamber will also increase the plasma diameter. Thus, by increasing or decreasing the power or pressure, the width of the wafer edge to be acted upon by the plasma can be controlled. Therefore, by controlling the dimensions, as well as various combinations of the power and pressure within the plasma cavity 106, the size of the edge region of the wafer that is acted upon can be affected.

Two electrodes are provided within the plasma cavity 106. An upper electrode 112 is disposed in the upper portion 102 at the top (as viewed) of the plasma cavity 106. A lower electrode 114 is disposed in the lower portion 102 at the bottom (as viewed) of the plasma cavity 106. The upper electrode 112 is connected to an RF source. The lower electrode 114 is connected to ground. The electrodes 112, 114 in the plasma cavity 106, the RF source and ground, and the gas(es) (described hereinbelow) introduced into the plasma cavity comprise, in aggregate, means for forming a plasma within the plasma cavity 106.

The upper and lower electrodes are parallel to each other, and are generally symmetric with one another in that they both have approximately the same inner and outer diameters approximately equaling the ID2 and OD2 of the plasma cavity 106, respectively, and that they have approximately the same surface area as one another, but it is within the scope of the invention that for certain applications one of the electrodes could be larger (e.g., extending further in from the periphery of the wafer) than the other.

The spacing between the two electrodes 112, 114 can easily be precisely controlled by machined stops, shims or the like in one or both of the electrode assemblies 112, 114. Generally, it is desired to have the upper electrode 112 disposed at a distance above the plane of wafer 200, and the lower electrode 114 at a similar distance below the plane of the wafer. Both electrodes 112, 114 barely overhang the edge of the wafer 200. This arrangement allows only the desired perimeter area of the electrode to be influenced by the plasma.

The two electrodes 112 and 114 are spaced a desired distance (d) apart. (The distance (d) is defined herein as the height H2 of the plasma cavity 106. Conversely, the height H2 of the plasma cavity 106 is defined by the spacing of the electrodes 112, 114.) The distance is selected based on the desired plasma conditions to be used and is typically on the order of several centimeters apart. The preferred electrode material is silicon of controlled resistivity so that the plasma generated has sufficient reactive properties to remove the undesired films on the wafer edge and bevel but not cause unwanted etching of the electrodes 112 and 114.

The inner (right, as viewed) leg portion of the upper portion 102 of the plasma chamber 100 is spaced apart from the inner (right, as viewed) leg portion of the lower portion 104 of the plasma chamber 100, establishing (forming) an "inner" annular gap 120 therebetween. This gap 120 leads from the inner (right, as viewed) external surface of the plasma chamber 100 to the plasma cavity 106. This inner gap 120 is annular since it allows for the edge region of the wafer to be inserted at all circumferential positions.

As best viewed in FIG. 2, the gap 120 allows for a peripheral edge region of the semiconductor wafer 200 to extend into the plasma chamber 100; more particularly, to within the plasma cavity 106. (In this example, the semi-conductor wafer 200 has a diameter of 295 mm and a thickness of 1 mm.) The gap 120 and the dimension (particularly ID2) of the plasma cavity 106 constitute means for receiving an edge region of the wafer 200 within the plasma cavity 106.

The outer (left, as viewed) leg portion of the upper portion 102 of the plasma chamber 100 is spaced apart from the outer (left, as viewed) leg portion of the lower portion 104 of the plasma chamber 100, establishing (forming) an "outer" gap 130 therebetween. This gap 130 leads from the plasma cavity 106 to the outer (left, as viewed) external surface of the plasma chamber 100. This outer gap 130 need not be annular, but could be a series of discrete openings or slots disposed at spaced-apart circumferential positions about the outer external surface of the plasma chamber 100. The outer gap 130 constitutes means for allowing gases to exit the plasma cavity without flowing over the surface of the wafer.

If the outer gap 130 is a series of openings, then the outer leg portion of the upper portion 102 of the plasma chamber 100 can be touching and supported by the outer (left, as viewed) leg portion of the lower portion 104 of the plasma chamber 100. If not, and if the upper and lower portions 102 and 104 are not touching, they must be supported with respect to one another with any suitable support means, which is certainly well within the purview of one skilled in the art to which the present invention most nearly pertains.

The upper electrode 112 is provided with numerous holes (not shown)—for example, 0.25 mm diameter holes disposed posed at every 5 degrees about the circumference of the upper electrode 112. An inlet manifold 140 leads from the upper (top, as viewed) external surface of the plasma chamber 100, through the holes in the upper electrode 112, to the plasma cavity 106.

A first, inert gas 210 is brought into the plasma cavity 106 by flowing it across the top and bottom (as viewed) surfaces of the wafer, through the inner gap 120. An example for the first gas 210 is Argon (Ar). This "inert" gas is selected so that it will not damage the circuit area of the wafer 200, although it forms an ionic part of the plasma. The inert gas protects the circuit area on the front side of the wafer. The inner gap 120 constitutes means for flowing an inert gas across a front and back side of the wafer into the plasma cavity 106. The inert gas 210 may typically comprise any one or combination of the following: helium, nitrogen, neon, and xenon.

A second, reactive gas 220 is provided directly to the plasma cavity 106 via the inlet manifold 140, through the holes (not shown) in the upper electrode 112; alternatively, or additionally, through holes (not shown) in the lower electrode 114. An example for the "reactive" second gas 220 is oxygen (O). Alternatively, rather than the second gas being flowed through holes in an electrode, a separate opening or openings (not shown) could be provided to get this gas directly into the plasma cavity 106, such as adjacent one and/or the other of the electrodes. The important thing here is that only the edge region of the wafer which is within the plasma cavity is exposed to the reactive gas (as well as to the plasma). By flowing "directly" into the plasma cavity 106, it is meant that the reactive gas is not, for example, flowed across the front or back side of the wafer; accordingly, the reactive gas can be of a type that would otherwise be avoided for the sake of not damaging the circuit area of the wafer. The holes in the upper electrode 112 or (alternatively) openings adjacent one of both of the electrodes constitute means for flowing a reactive gas directly into the plasma cavity 106. The reactive gas 220 may typically comprise any one or combination of the following: oxygen, tetrafluoromethane, trifluoromethane, difluoromethane, fluoromethane, hexafluoroethylene, octafluorocyclotetrabutane, ozone, nitrogen trifluoride, ammonia, chlorine, fluorine, hydrogen chloride, hydrogen bromide, hydrogen fluoride, and sulfur hexafluoride.

The inert and reactive gases flow out of (exit) the plasma cavity 106 via the outer gap 130. This is the overall pressure flow—basically from right-to-left in the drawings.

According to the invention, a plasma is formed in the plasma cavity 106 of the plasma chamber 100 through a radio frequency (RF) discharge across the two electrodes 112 and 114, typically at (but not limited to) 13.56 MHz.

The plasma chamber of the present invention creates a toroidal plasma which is located only at the edge region of the wafer. The two electrodes 112 and 114 are disposed at the edge of the wafer. The edge of the wafer is disposed between the two electrodes. The plasma will principally occur between the two electrodes, thereby avoiding damaging the circuit area of the wafer. This arrangement allows only the desired perimeter area of the electrode to be influenced by the plasma.

At this point, the differences between the present invention and the system of Jeon will be apparent. In Jeon the wafer is powered, with an electrode under the circuit area of the wafer. The plasma is generally prevented from forming over the wafer face by keeping the gap of the gas distribution panel (GDP) and the wafer face to less than the Debye length. Most importantly, in Jeon the wafer receives full application of RF power. The GDP is not capable of completely preventing etching of the wafer face.

In the present invention, the spacing between the two electrodes can be precisely controlled by machined stops in one or both of the electrode assemblies. Controlling the gap over the apparatus described by Jeon is difficult and prone to non-uniformity in parallelism to the very important wafer face.

In Jeon, the gases that are used in the plasma are introduced in the electrode assembly and not over the wafer face. In the present invention, an inert gas is flowed over both the front and back of the wafer. Through proper design the reactants formed in the plasma cannot diffuse to any appreciable extent onto the wafer face.

In the present invention, dimensions are established so that the inner diameter ID2 of the plasma cavity 106 is slightly, such as 1-2 mm smaller than the diameter of the wafer 200 so that the action of the plasma on the wafer is limited to the edge region of the wafer 200.

The inert gas 210 is brought into the plasma cavity 106 across the wafer 200 and through the gap 120 created above and below the wafer. This gap 120 is only slightly greater than the thickness of the wafer; for example, there is about 0.5 mm on each side of the wafer (i.e., with a 1.5 mm thick wafer, the overall gap thickness would be 1.5+2*0.5=2.5 mm) so that the plasma does not extend into it and onto the main (active device) portion of the wafer 200. Also the small gap 120 reduces the likelihood of back streaming of reactive gases onto the device area of the wafer 200. The toroid assembly and wafer are held in a chamber at the operating pressure of the plasma.

Typical operating conditions of the plasma include:
pressure of the system of between 1 to 10 Torr, total gas flow of 100 to 500 sccm of reactive and inert gases with reactive gases being in the range of 5 to 100 sccm, and
RF power at 13.56 MHz at 10 to 500 Watts.

A typical edge cleaning process can take from several seconds to a number of minutes. Endpoint detection is generally not necessary, but fiber optics or the like could be built in to monitor the plasma.

Gas(es) flow into the plasma cavity 106 where a radio frequency (RF) signal is applied across the electrodes and a plasma is generated. The reactive ions thus created remove the film on the edge region of the wafer 200. Selection of the gas(es) will determine which films are removed. For example, argon, $CF_4$, $CHF_3$, and oxygen in optimal proportions can be used to remove films such as silicon dioxide, silicon nitride, or silicon oxynitride. Films like silicon carbide and tantalum nitride can be etched in plasmas using argon and $CF_4$ as the reactant. Films created during plasma etch processes, often fluorocarbon polymers, can be readily removed with an argon-oxygen plasma.

These gases do not react with the wafer except when within the plasma volume. The gases flow over the wafer from above and below the center of the wafer, into the toroid and out through the center perimeter edge of the toroid. The inner diameter of the toroidal dielectric ring is such that the width of the wafer perimeter to be etched is well controlled and can be influenced by the total flow of all gases. A high inert gas flow 210 ensures little or no diffusion of reactants from the plasma reaching the critical device area of the wafer.

A typical process flow is to place the wafer concentrically in the chamber so that the edge region will be exposed to a uniform amount of plasma at all circumferential positions of the wafer. The chamber is taken to a pressure of less than 100 mTorr to remove air and an inert flow 210 of argon (Ar) at 500 sccm is begun. After purging all air from the chamber the system pressure is brought to the desired level and the reactive gas flow 220 is begun and stabilized. The plasma is initiated at about 500 Watts and after several seconds of stabilization the power is adjusted to its predetermined level. The plasma is run for the predetermined time to remove the film(s) desired and extinguished by turning off the RF power or stopping reactive gas flow 220 followed by stopping the RF signal. The chamber is taken to 100 mTorr to purge all reactive gases and byproducts. The inert gas flow 220 is stopped and nitrogen may be used to increase the chamber pressure to atmosphere or to a pressure compatible with any loadlock system used. The wafer 200 is removed and the process repeated on another wafer.

When removing several films, such as organic polymers from the application of low k dielectrics, followed by inorganic films such as oxide, nitride, or carbides of silicon, the reactive gas 220 can be changed as suits the needs of the film removal. Removing organics is readily accomplished with $Ar/O_2$ or Ar/ozone plasma and when the organic has been removed the oxygen flow is stopped or reduced and gases such as $CF_4$, $CHF_3$ are started. This new condition will etch silicon oxide, silicon nitride and silicon oxy-nitride. To remove films like silicon carbide or tantalum nitride or oxide only $CF_4$ and oxygen are combined with Ar.

Removal of deposited films from a reactive ion etching (RIE) process is often needed to reduce or eliminate particulate from film on the wafer perimeter. Application of this invention can be easily applied to removing unwanted organofluoropolymer common RIE process including the application of an SiLk® RIE process. The oxygen plasma commonly used to strip photoresist or fluorocarbon polymer from the bevel edge of the wafer cannot be used as the organic low k will be destroyed. The plasma can also be applied to carbon modified silicon oxides (SiCOH) where even short oxygen plasma strips cause damage to the exposed SiCOH films. Organofluoropolymers condense on the bevel and backside perimeter of the wafer during the RIE process when gases such as $CF_4$ and $CHF_3$ and $C_4F_8$, $CH_2F_2$, $CH_3F$ are used. These polymers are incapable of being removed with wet chemical techniques.

The plasma operating on the edge region of the wafer can be controlled to remove all or a selected amount of the film by the action of the reactive gas(es) on the film.

The toroidal plasma system incorporates a shroud of inert or non-reactive gas flowing over the wafer radially outward from the wafer center into the region of the toroidal plasma thus providing protection to the wafer device area. Unwanted byproducts of the plasma action on the wafers edge can be removed by this shrouding of inert gas near the edge of the wafer over the device area.

It is within the scope of the invention that the plasma chamber is in the form of a segment of a torus (for example, 60 degrees or one sixth), in which case the wafer could be rotated so that the edge region treatment can be provided at all circumferential positions of the wafer. This segmentation can be exploited to carry out different etches in sequence. For example, having two toroidal plasma chamber segments at different circumferential positions, each performing a given etch.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of treating a peripheral edge region of a wafer comprising the steps of:

providing a plasma chamber having a U-shaped upper portion and an opposing U-shaped lower portion, and including a toroidal shaped plasma cavity therebetween;

providing two electrodes in the plasma cavity, an upper electrode disposed at an upper portion of the plasma cavity and a lower electrode disposed at a lower portion of the plasma cavity;

providing an inner annular gap extending from an external surface of the plasma chamber into the plasma cavity between the upper and lower electrodes;

providing an outer gap leading from the plasma cavity to the outer surface of the plasma chamber between the upper and lower electrodes;

disposing only the peripheral edge region of the wafer through the annular inner gap and within the plasma cavity;

flowing a reactive gas directly into the plasma cavity; forming a plasma within the plasma cavity;

exiting the reactive gas from the plasma cavity through the outer gap; and flowing an inert gas across a front and back side of the wafer and through the inner annular gap and across the peripheral edge of the wafer disposed within the plasma cavity and out through the outer gap whereby the reactive gas exits the plasma cavity without flowing over the back or front side of the wafer.

2. A method, according to claim 1, wherein the step of forming the plasma further comprises:

connecting the upper electrode to an RF source; and connecting the lower electrode to ground.

3. A method, according to claim 1, further comprising the step of:

controlling a spacing between the upper and lower electrodes wherein the spacing defines the height of the plasma cavity.

4. An apparatus for treating an edge region of a wafer comprising:
 a plasma chamber having a U-shaped upper portion and an opposing U-shaped lower portion, and including a toroidal shaped plasma cavity therebetween and the toroidal shaped plasma cavity having an inner diameter which is slightly less than an overall diameter of a wafer being treated so that only an edge region of the wafer extends into the plasma cavity;
 means for receiving an edge region of the wafer within the plasma cavity, the means including an annular gap extending from an inner surface of the plasma chamber into the plasma cavity for allowing the edge region of the wafer to extend into the plasma cavity;
 means for forming a plasma within the plasma cavity, the means for forming the plasma comprises an upper electrode disposed in an upper portion of the plasma cavity and a lower electrode disposed in a lower portion of the plasma cavity and holes in at least one of the upper and lower electrodes for flowing a reactive gas directly into the plasma cavity; and
 means for flowing an inert gas across a front and back side of the wafer and through the annular gap disposed between the upper and lower portions of the plasma chamber into the plasma cavity whereby the reactive gas exits the plasma cavity without flowing over the back or front side of the wafer.

5. An apparatus, according to claim 4, further comprising means for allowing gases to exit the plasma cavity without flowing over the surface of the wafer.

6. An apparatus, according to claim 4, wherein:
 the toroidal shaped plasma cavity is defined by a toroidal shaped plasma chamber; and
 the plasma chamber has an annular gap on an inner surface thereof for allowing the edge region of the wafer to extend into the plasma cavity;
 wherein the wafer has a thickness, and the annular gap has thickness which is slightly greater than the thickness of the wafer.

7. An apparatus, according to claim 4, wherein, the plasma chamber has a gap on an outer surface thereof for allowing gases to flow out of the plasma cavity, and the gap comprises a single gap extending entirely around the chamber, or a series of discrete openings or slots disposed at spaced-apart circumferential positions about the outer external surface of the plasma chamber.

8. An apparatus for treating a peripheral edge region of a wafer comprising:
 means for providing a plasma chamber having a U-shaped upper portion and an opposing U-shaped lower portion, and including a toroidal shaped plasma cavity therebetween;
 means for providing two electrodes in the plasma cavity, an upper electrode disposed at an upper portion of the plasma cavity and a lower electrode disposed at a lower portion of the plasma cavity;
 means for providing an inner annular gap extending from an external surface of the plasma chamber into the plasma cavity between the upper and lower electrodes;
 means for providing an outer gap leading from the plasma cavity to the outer surface of the plasma chamber between the upper and lower electrodes;
 means for disposing only the peripheral edge region of the wafer through the annular inner gap and within the plasma cavity;
 means for flowing a reactive gas directly into the plasma cavity;
 means for forming a plasma within the plasma cavity;
 means for exiting the reactive gas from the plasma cavity through the outer gap; and
 means for flowing an inert gas across a front and back side of the wafer and through the inner annular gap and across the peripheral edge disposed within the plasma cavity and out through the outer gap whereby the reactive gas exits the plasma cavity without flowing over the back or front side of the wafer.

9. An apparatus, according to claim 8, wherein the upper and lower electrodes are parallel to one another.

10. An apparatus, according to claim 8, wherein the upper and lower electrodes have approximately the same surface area as one another.

11. An apparatus, according to claim 8, wherein the wafer has a thickness; and the inner annular gap has thickness which is slightly greater than the thickness of the wafer.

12. An apparatus, according to claim 8, wherein, the plasma chamber has a gap on an outer surface thereof and leading from the outer gap for allowing gases to flow out of the plasma cavity.

* * * * *